(12) United States Patent
Liang et al.

(10) Patent No.: US 8,085,058 B2
(45) Date of Patent: Dec. 27, 2011

(54) APPARATUS FOR ADJUSTING DIFFERENTIAL PROBE

(75) Inventors: Hsien-Chuan Liang, Taipei Hsien (TW); Shen-Chun Li, Taipei Hsien (TW); Shou-Kuo Hsu, Taipei Hsien (TW); Yung-Chieh Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 205 days.

(21) Appl. No.: 12/625,571

(22) Filed: Nov. 25, 2009

(65) Prior Publication Data
US 2011/0025355 A1 Feb. 3, 2011

(30) Foreign Application Priority Data
Aug. 3, 2009 (CN) .......................... 2009 1 0305116

(51) Int. Cl.
*G01R 31/20* (2006.01)
*G01R 1/067* (2006.01)
(52) U.S. Cl. .......... 324/754.01; 324/755.07; 324/755.11
(58) Field of Classification Search ............... 324/72.5, 324/750.01–750.3, 754.01–754.3, 755.01–755.11, 324/762.01–762.09; 439/92, 98, 482
See application file for complete search history.

(56) References Cited

U.S. PATENT DOCUMENTS

| | | | |
|---|---|---|---|
| 6,276,956 B1 * | 8/2001 | Cook | 439/482 |
| 6,967,473 B1 * | 11/2005 | Reed et al. | 324/149 |
| 7,212,018 B2 * | 5/2007 | Annichiarico et al. | 324/755.01 |

* cited by examiner

*Primary Examiner* — Huy Q Phan
*Assistant Examiner* — Tung X. Nguyen
(74) *Attorney, Agent, or Firm* — Altis Law Group, Inc.

(57) ABSTRACT

An apparatus for adjusting a differential probe includes a regulator arranged therein capable of adjusting a distance between two tips of the probe. The probe is supported on the apparatus. The apparatus includes a rotatable shaft and a rotatable disk. The rotatable shaft engages with the regulator of the probe. The rotatable disk is mounted surrounding the rotatable shaft and rotatable together with the rotatable shaft. An angular ruler or a radian ruler is described on an outer surface of the rotatable disk to indicate a rotation angle or a rotation radian of the rotatable shaft, therefore the distance between the two tips of the probe are accurately adjusted.

11 Claims, 5 Drawing Sheets

APPARATUS FOR ADJUSTING DIFFERENTIAL PROBE

BACKGROUND

1. Technical Field

The present disclosure relates an apparatus for accurately adjusting a differential probe.

2. Description of Related Art

A test probe is often used to test an electronic device and connect to a display device, such as an oscilloscope, to show a test result. Differential probes are widely used and each includes two metal tips capable of contacting test points of an electronic device to be tested. The distance between the two tips can be adjusted by a screw driver extending into the test probe to rotatably engage with a regulator of the test probe. However, this process of adjustment is inaccurate and inconvenient.

DETAILED DESCRIPTION

Figure 1:
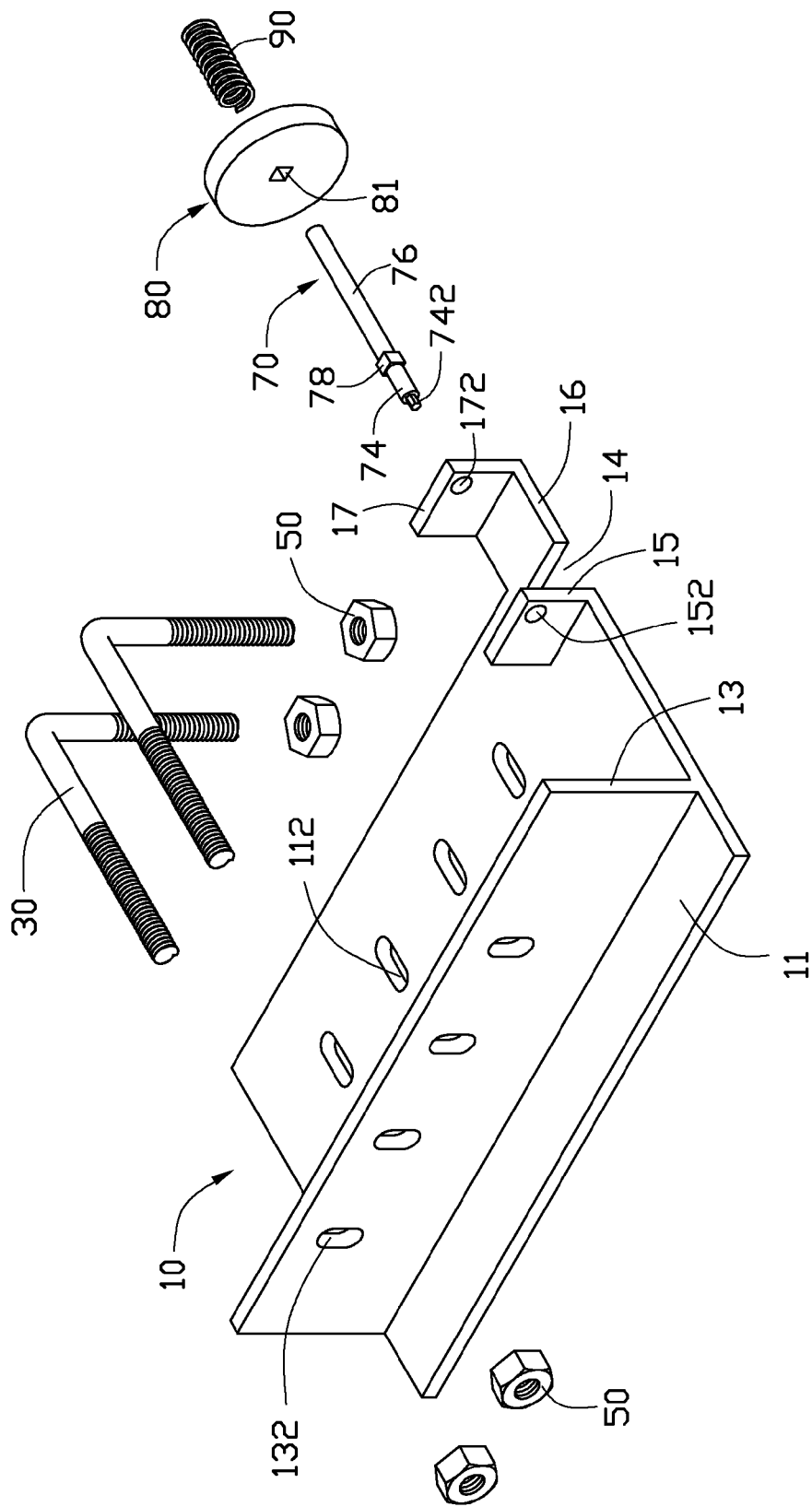
FIG. 1 is an exploded view of an embodiment of an apparatus for adjusting a differential probe, the apparatus includes a rotatable disk.
Figure 2:
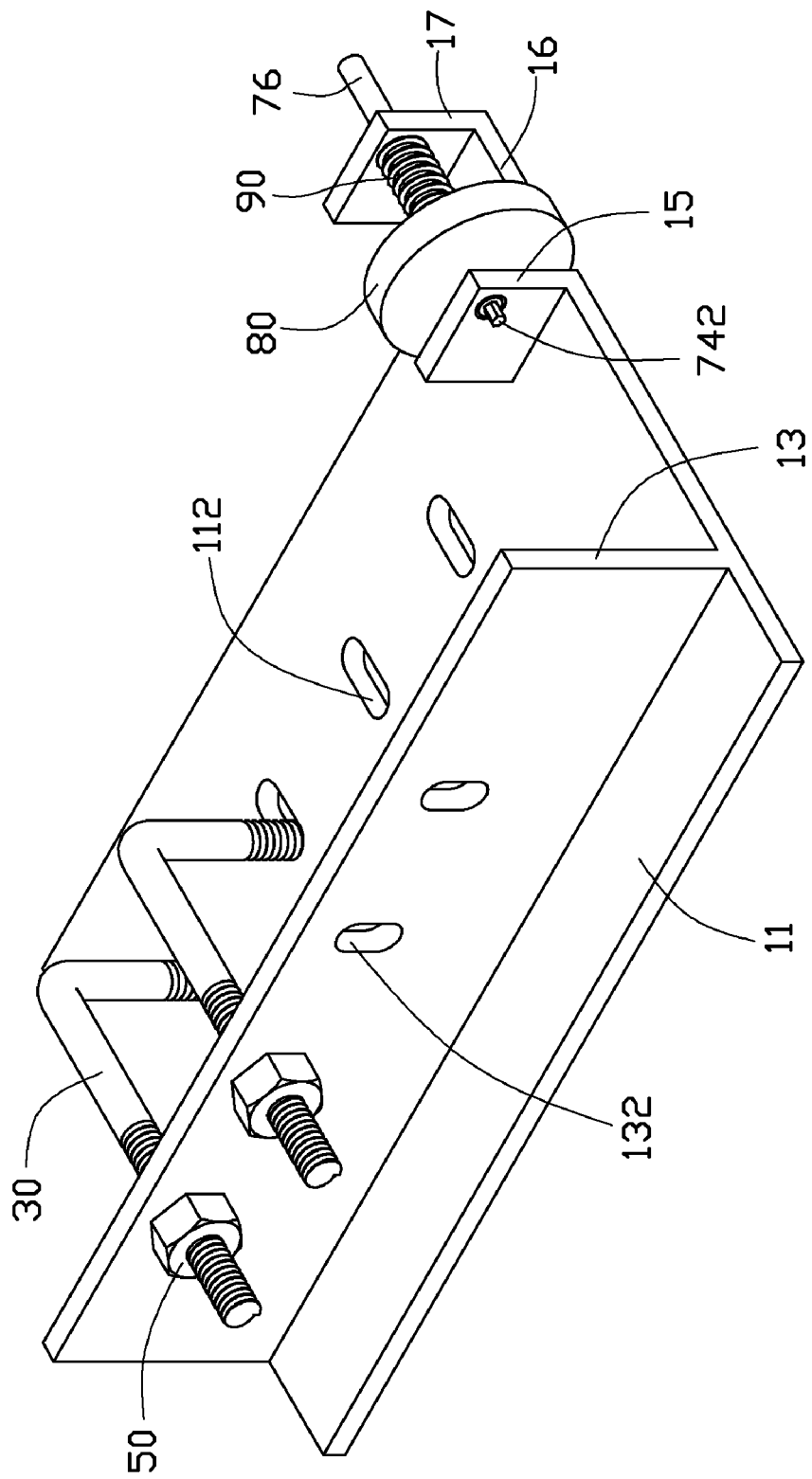
FIG. 2 is an isometric view of the apparatus of FIG. 2.
Figure 4:
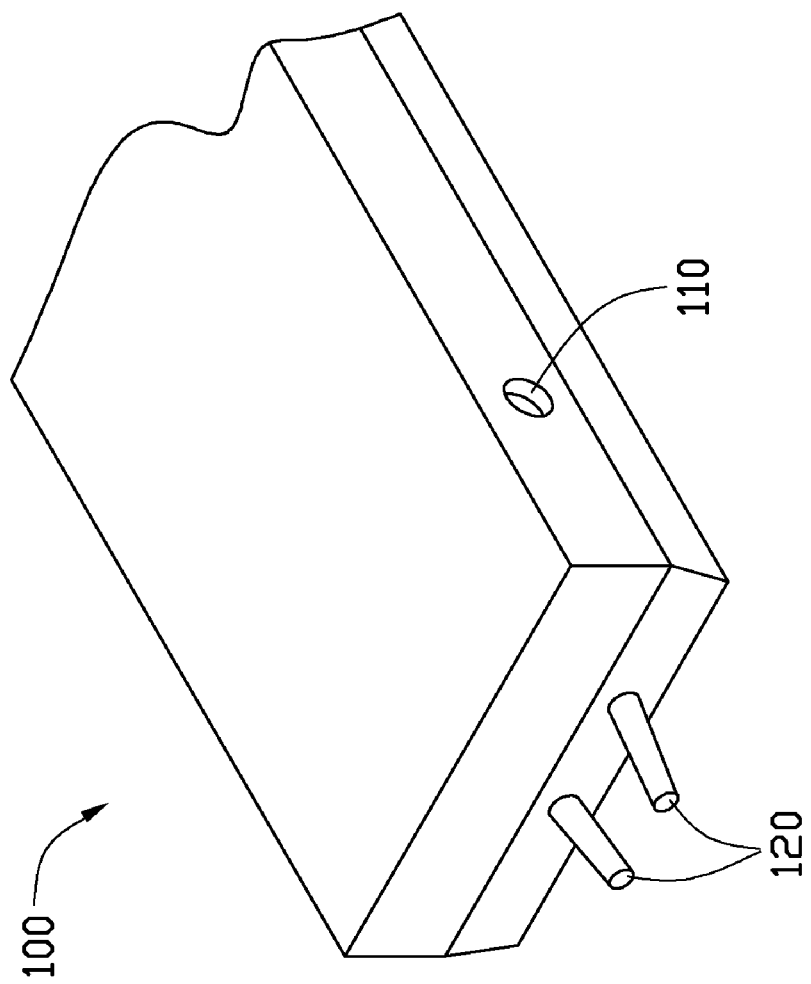
FIG. 4 is an isometric view of a differential probe.

Referring to FIGS. 1, 2, and 4, an embodiment of an apparatus 1 is used to accurately adjust a distance between two tips 120 of a differential probe 100. The differential probe 100 defines a hole 110 in a first sidewall. The hole 110 corresponds to a regulator of the probe 100. In this embodiment, the regulator is a hexagonal slot. The apparatus 1 includes a support member 10, two L-shaped retaining rods 30, four nuts 50, a rotatable shaft 70, a rotatable disk 80, and a resilient member 90. In this embodiment, the resilient member 90 is a coil spring. Each of the retaining rods 30 includes two threaded ends.

The support member 10 includes a rectangular base 11, and a sidewall 13 projecting from the base 11 perpendicularly. The base 11 defines a plurality of long through holes 112. Each of the holes 112 extends perpendicular to the sidewall 13. The sidewall 13 defines a plurality of long through holes 132. The holes 132 correspond to the holes 112. Each of the holes 132 extends perpendicular to the base 11. A length of each of the holes 112, 132 is longer than a diameter of each of the two retaining rods 30. An extension plate 16 perpendicular to the sidewall 13 extends from a longer side of the base 11. The base 11 defines a rectangular opening 14 along a shorter side of the base 11, adjacent the extension plate 16. A baffle plate 15 extends perpendicularly from a side of the opening 14 away from the extension plate 16. A baffle plate 17 extends perpendicularly from a distal end of the extension plate 16. The baffle plate 15 defines a through hole 152. The baffle plate 17 defines a through hole 172 corresponding to the through hole 152.

The rotatable shaft 70 includes two ends 74 and 76. A rectangular flange 78 detachably and splinedly engages with the rotatable shaft 70. A tuning head 742 extends from the end 74 of the rotatable shaft 70, capable of extending into the hole 110 of the differential probe 100. In this embodiment, the tuning head 742 is hexagonal. The rotatable disk 80 defines a rectangular through hole 81.

Figure 5:
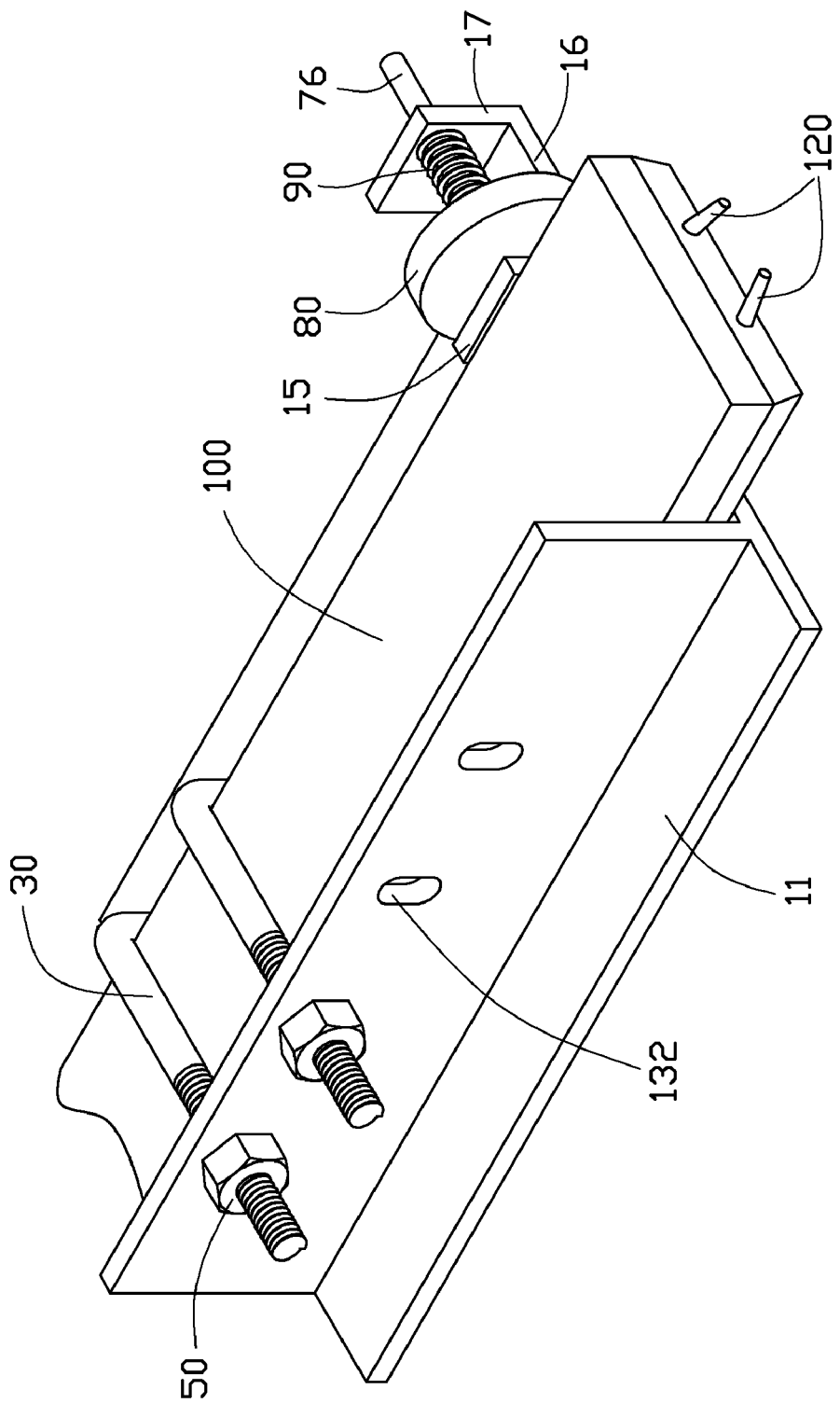
FIG. 5 is an isometric view of the apparatus of FIG. 2 with the differential probe of FIG. 4 supported thereon.

Referring to FIG. 5, in assembly, the differential probe 100 is placed on the base 11 of the support member 10, with a second sidewall of the differential probe 100 abutting the sidewall 13 of the support member 10 and the hole 110 of the differential probe 100 in alignment with the hole 152 of the baffle plate 15. One of the two retaining rods 30 is passed through one of the through holes 112 and one of the through holes 132 correspondingly. The other one of the two retaining rods 30 is passed through the other through hole 112 and the other through hole 132 correspondingly. The two retaining rods 30 abut the differential probe 100, corresponding to the size of the differential probe 100. The four nuts 50 engage with the threaded ends of the two retaining rods 30 correspondingly, thereby fixing the differential probe 100 on the support member 10. The rotatable disk 80 is located in the opening 14 with the rectangular through hole 81 facing the through holes 152, 172. The end 74 of the rotatable shaft 70 is sequentially passed through the through hole 172 of the baffle plate 17, the resilient member 90, the rectangular flange 78, the rotatable disk 80, and the through hole 152 of the baffle plate 15. The rectangular flange 78 is non-rotatably engaged in the through hole 81 of the rotatable disk 80. The rotatable disk 80 is drawn towards the baffle plate 17 and depresses the resilient member 90 so that the tuning head 742 faces the hole 110 of the differential probe 100. The rotatable disk 80 is released and the resilient member 90 returns to normal to allow the tuning head 742 to extend through the hole 110 and engage in the hexagonal prism slot of the regulator of the differential probe 100.

Figure 3:
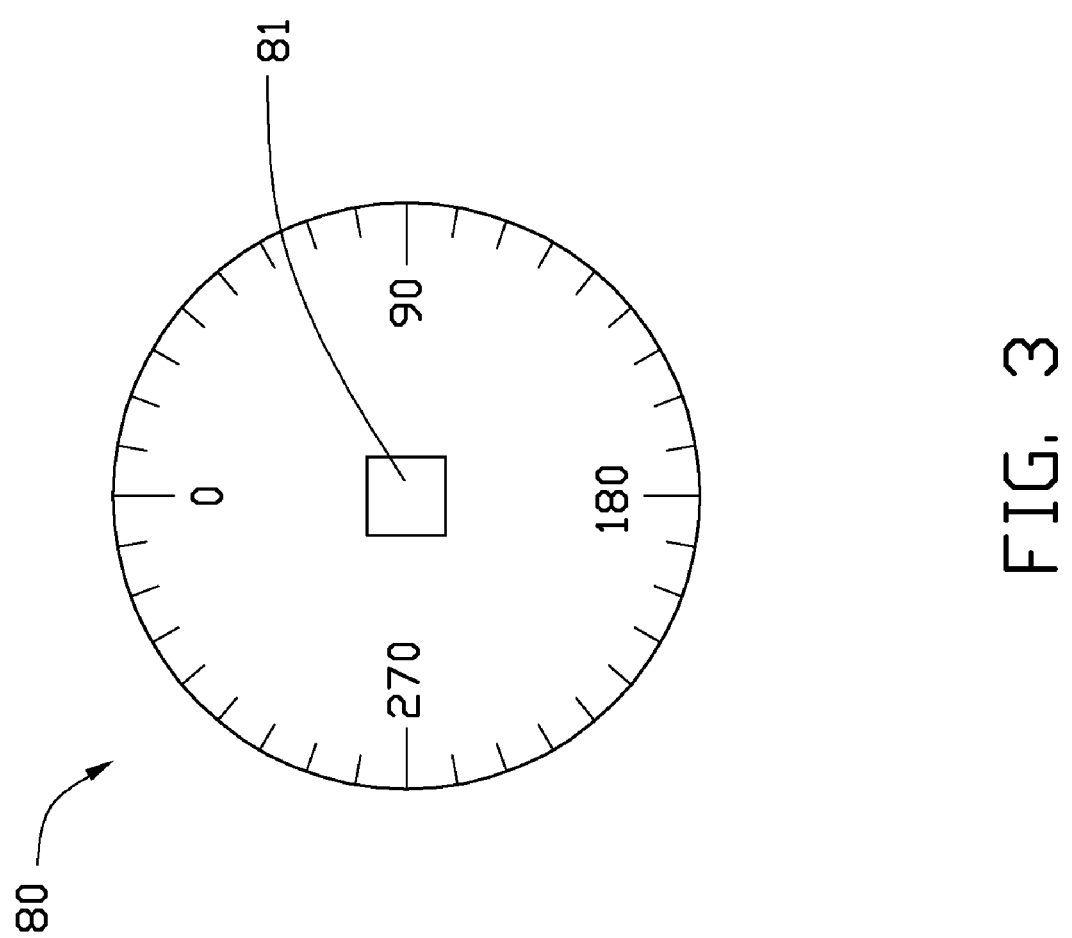
FIG. 3 is a planar view of the rotatable disk of FIG. 2.

Referring to FIG. 3, an angular ruler is inscribed on an outer surface of the rotatable disk 80. The rotatable disk 80 rotates together with the rotatable shaft 70. The extension plate 16 of the support member 10 can be used as a guide to reference the angular ruler on the rotatable disk 80.

In use, the end 76 of the rotatable shaft 70 is rotated, the tuning head 742 rotates to adjust the regulator of the differential probe 100, and the distance between the two tips 120 of the differential probe 100 is thus adjusted. The rotatable shaft 70 can be rotated accurately. For example, if the extension plate 16 points to 90 degrees of the angular ruler initially, it then points to 180 degrees of the angular ruler after rotating the rotatable shaft 70 by 90 degrees. The value of the required angle of rotation of the rotatable shaft 70 is determined according to the equation $\delta = 2\pi s/d$, wherein $\delta$ is the required rotation angle, $s$ is a required distance between the two tips 120, and $d$ is a change value of distance between the two tips 120 after the rotatable shaft 70 is rotated by an angle of 360 degrees.

In other embodiment, a radian ruler can be described on the outer surface of the rotatable disk 80 instead of the angular ruler. In this condition, a value of a required rotation radian of the rotatable shaft 70 is determined according to the equations $D = r\delta = 2\pi rs/d$, wherein $D$ is the required rotation radian of the rotatable shaft 70, and $r$ is a radius of the rotatable disk 80.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An apparatus for adjusting a differential probe, the probe comprising a regulator arranged therein capable of adjusting a distance between two tips of the differential probe, the apparatus comprising:
   a support member supporting the differential probe;
   a rotatable shaft pivotally coupled to the support member to engage with the regulator of the differential probe;
   a rotatable disk mounted surrounding the rotatable shaft and pivoted together with the rotatable shaft, an angular ruler or a radian ruler is described on an outer surface of the rotatable disk to indicate a rotation angle or a rotation radian of the rotatable shaft; and
   a tuning head extending from an end of the rotatable shaft, and engaging with the regulator to rotate the regulator.

2. The apparatus of claim 1, wherein the support member comprises a rectangular base, an extension plate extends from a longer side of the base, an opening is defined in the base along a shorter side of the base, adjacent the extension plate, a first baffle plate extends perpendicularly from a side of the opening away from the extension plate, a second baffle plate extends perpendicularly from a distal end of the extension plate, and the rotatable shaft passes through the first and second baffle plates with the rotatable disk located in the opening.

3. The apparatus of claim 2, further comprising a resilient member, the tuning head sequentially passes through the first baffle, the resilient member, the rotatable disk, and the second baffle plate.

4. The apparatus of claim 1, wherein the rotatable disk defines a through hole in the center of the rotatable disk, a rectangular flange detachably and splinedly engages with the rotatable shaft, and non-rotatably engages with the through hole of the rotatable disk.

5. The apparatus of claim 2, wherein the support member further comprises a sidewall projecting from the base perpendicularly, the differential probe is placed on the base, with a sidewall of the differential probe abutting the sidewall.

6. The apparatus of claim 5, further comprising at least one L shaped retaining rod, each comprising two threaded ends; the base defines at least one first long through hole, each of the at least one first long through hole extends perpendicular to the sidewall; the sidewall defines at least one second long through hole corresponding to the at least one first long through hole, each of the at least one second long through hole extends perpendicular to the base; two ends of each of the at least one L shaped retaining rod is passed through the at least one first long through hole and the at least one second long through hole correspondingly, and engages with two nuts correspondingly, thereby fix the differential probe on the support member.

7. The apparatus of claim 6, wherein a length of each of the at least one first long through hole and the at least one second long through hole is greater than a diameter of the corresponding L shaped threaded rod.

8. The apparatus of claim 1, wherein a required rotation angle of the rotatable shaft is determined according to the equation $\delta=2\pi s/d$, wherein $\delta$ is the required rotation angle, s is a required distance between the two contact ends, and d is a change value of distance between the two contact ends after the rotatable shaft is rotated by an angle of 360 degrees.

9. The apparatus of claim 1, wherein a required rotation radian of the rotatable shaft is determined according to the equations $D=2\pi rs/d$, wherein D is the required rotation radian of the rotatable shaft, s is a required distance between the two contact ends, d is a change value of distance between the two contact ends after the rotatable shaft is rotated by an angle of 360 degrees, and r is a radius of the rotatable disk.

10. An apparatus for adjusting a differential probe, the probe comprising a regulator arranged therein to tuning a distance between two tips of the differential probe, the apparatus comprising:
    a support member comprising a base supporting the differential probe, two baffle plate projecting from the base perpendicularly, parallel to each other;
    a rotatable shaft passes through the first and second baffle plates, and being moveable along an axis of the rotatable shaft; and
    a rotatable disk engaging and pivoted together with the rotatable shaft, and located between the two baffle plates; wherein
    the rotatable shaft extends in the differential probe to engage with the regulator of the differential probe, the regulator rotates with the rotatable shaft, an angular ruler or a radian ruler is inscribed on an outer surface of the rotatable disk, to indicate a rotation angle or a rotation length of the rotatable shaft.

11. An apparatus for adjusting a differential probe, the probe comprising a regulator arranged therein capable of adjusting a distance between two tips of the differential probe, the apparatus comprising:
    a support member supporting the differential probe;
    a rotatable shaft pivotally coupled to the support member to engage with the regulator of the differential probe;
    a rotatable disk mounted surrounding the rotatable shaft and pivoted together with the rotatable shaft, an angular ruler or a radian ruler is described on an outer surface of the rotatable disk to indicate a rotation angle or a rotation radian of the rotatable shaft;
    wherein the rotatable disk defines a through hole in a center of the rotatable disk, a rectangular flange detachably and splinedly engages with the rotatable shaft, and non-rotatably engages with the through hole of the rotatable disk.

* * * * *